(12) United States Patent  
Chatal et al.

(10) Patent No.: US 7,511,541 B2  
(45) Date of Patent: Mar. 31, 2009

(54) ELECTRONIC DRIVER DEVICE FOR AN EXTERNAL LOAD FOR WHICH THE SLEW RATE OF THE OUTPUT SIGNAL IS INDEPENDENT OF THE EXTERNAL LOAD CAPACITY AND THE CORRESPONDING INTEGRATED COMPONENT

(75) Inventors: Joel Chatal, Carquefou (FR); Abdellatif Benraoui, Saint-Julien de Concelles (FR)

(73) Assignee: Atmel Nantes SA, Nantes (FR)

( * ) Notice: Subject to any disclaimer, the term of this patent is extended or adjusted under 35 U.S.C. 154(b) by 105 days.

(21) Appl. No.: 11/712,225

(22) Filed: Feb. 28, 2007

(65) Prior Publication Data

US 2007/0205814 A1    Sep. 6, 2007

(30) Foreign Application Priority Data

Feb. 28, 2006  (FR) ................... 06 01789

(51) Int. Cl.
*H03B 1/00* (2006.01)
*H03K 4/06* (2006.01)

(52) U.S. Cl. .................. 327/111; 327/108; 327/132

(58) Field of Classification Search ............. 327/108, 327/111, 112, 130–131, 132
See application file for complete search history.

(56) References Cited

U.S. PATENT DOCUMENTS

| 5,598,119 A | 1/1997 | Thayer et al. ............ 327/111 |
| 6,107,833 A | 8/2000 | Yoshida .................. 326/83 |
| 6,842,058 B2 * | 1/2005 | McNitt et al. ........... 327/170 |
| 2003/0052369 A1 | 3/2003 | Kajimoto ............. 257/368 |
| 2004/0257127 A1 | 12/2004 | Levin et al. ............. 327/112 |
| 2005/0116749 A1 | 6/2005 | Pentakota et al. ....... 327/131 |

FOREIGN PATENT DOCUMENTS

EP    0 164 615    12/1985

* cited by examiner

*Primary Examiner*—Dinh T. Le
(74) *Attorney, Agent, or Firm*—Westman, Champlin & Kelly, P.A.

(57) ABSTRACT

This disclosure relates to an electronic driver device for an external load to which an input signal is applied at its input and that produces an output signal to the external load from its output. Such an electronic driver device includes elements that reduce dependence of the slew rate of the output signal on the external load capacitance.

15 Claims, 8 Drawing Sheets

Fig. 1

(PRIOR ART)

ELECTRONIC DRIVER DEVICE FOR AN EXTERNAL LOAD FOR WHICH THE SLEW RATE OF THE OUTPUT SIGNAL IS INDEPENDENT OF THE EXTERNAL LOAD CAPACITY AND THE CORRESPONDING INTEGRATED COMPONENT

CROSS-REFERENCE TO RELATED APPLICATION

None.

FIELD OF THE DISCLOSURE

The field of the disclosure is output buffers. Such buffers are well known according to prior art. They are located at the periphery of an integrated circuit and are used to interface electrical signals between the internal and external parts of the circuit. An integrated circuit usually includes several output buffers.

The disclosure is particularly applicable to output buffers with a controlled output signal slew rate.

BACKGROUND

Most output buffers comprise a control function to adjust a maximum slew rate of the output voltage in response to a voltage step applied at the input to the buffer.

Figure 1:
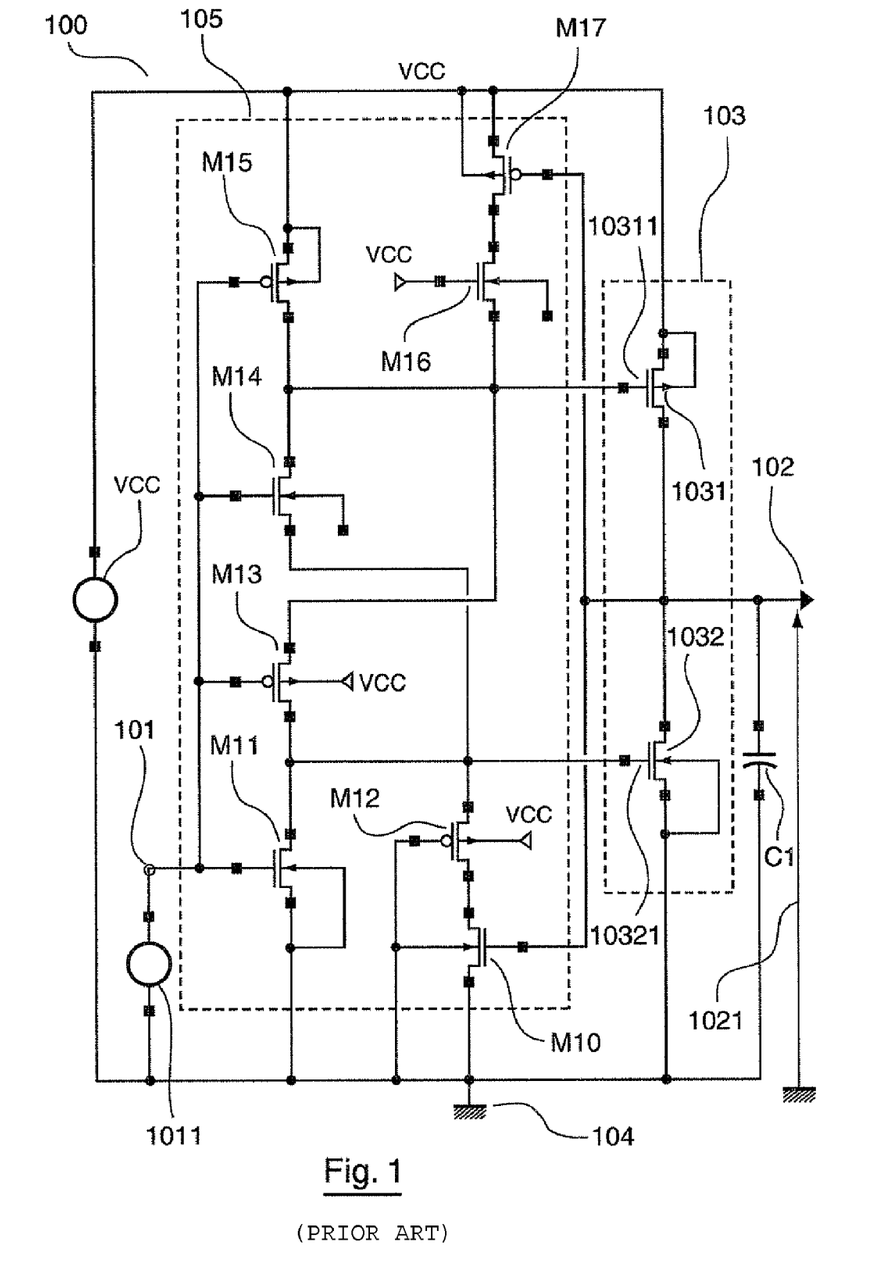
FIG. 1 shows an electric diagram of a conventional output buffer 100.

The electrical diagram for a conventional output buffer 100 according to the state of the art is presented with reference to FIG. 1. This output buffer 100 is powered by a power supply VDC and it comprises an input 101 onto which an input signal 1011 is applied and an output 102 on which the maximum slew rate can be measured starting from the voltage of the output signal 1021 measured at the terminals of the capacitor C1 of a load (placed between the output potential 102 and the ground 104).

This output buffer 100 comprises an output stage 103 that itself comprises a first PMOS type of output transistor 1031 and a second NMOS type of output transistor 1032.

The output buffer 100 also includes a block 105 comprising eight transistors M10 to M17 (block 105 being powered by the power supply voltage VDC). This processing block 105 controls the maximum slew rate of the output signal 103. It uses the input signal 1011 to output the control for the first gate 10311 and the second gate 10321 of the first and second transistors 1031 and 1032 of the output stage 103.

FIGS. 2A to 2E present curves of the output voltage 1021 (FIG. 2B), the first gate voltage 10312 (FIG. 2D), the second gate voltage 10322 (FIG. 2C) and the drain current 106 (FIG. 2E) from the transistor M17 of the output buffer in FIG. 1 in response to an input signal 1011 in the form of a voltage step changing from 0 to VDC (FIG. 2A), as a function of time t (in milliseconds).

The voltage curves are shown in V and the current 106 in mA. The time steps of the curves in FIGS. 2A to 2D are the same as the time steps of the curve in FIG. 2E.

The voltage step (FIG. 2A) from 0 to VDC applied at the input 101 corresponds to a transition from a logical 0 to a logical 1.

Figure 2A:
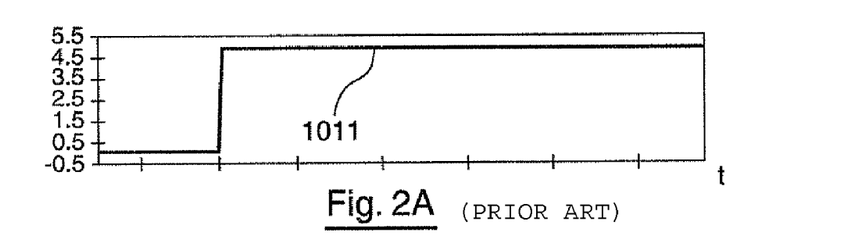
FIGS. 2A to 2E present curves for this conventional output buffer 100 showing the output voltage (FIG. 2B), the first gate voltage (FIG. 2D) and the second gate voltage (FIG. 2C) and the drain current (FIG. 2E) from transistor M17 in the buffer in FIG. 1 in response to a voltage step changing from 0 to 5V (FIG. 2A), as a function of time.
Figure 2B:
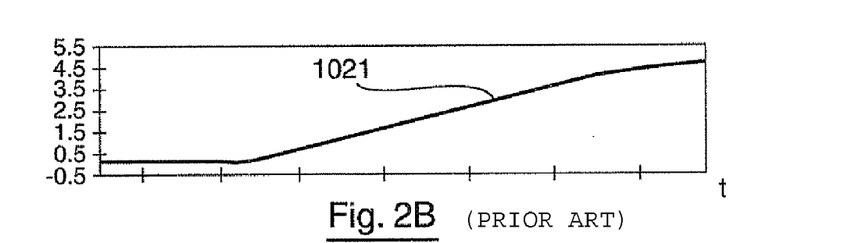
Figure 2C:
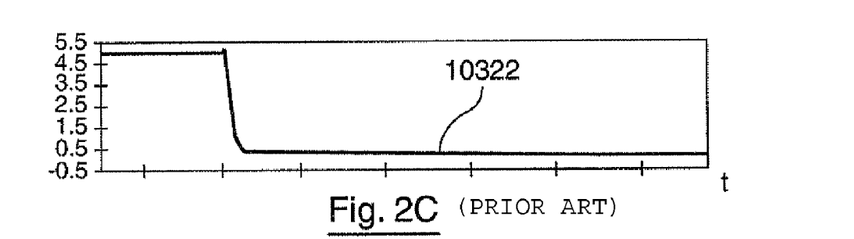
Figure 2D:
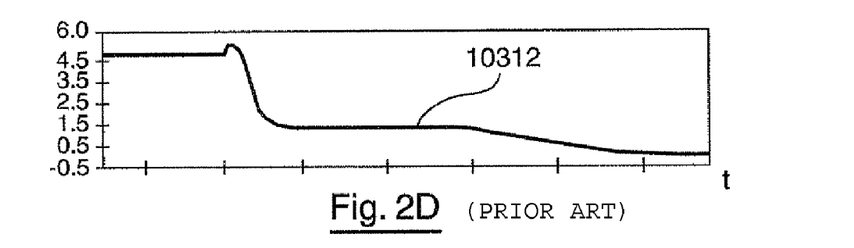

Starting from such a transition from a logical 0 to a logical 1 at the input signal 1011, the transistor M11 becomes conducting and the second gate voltage 10322 drops quickly from VDC to 0 (as shown in FIG. 2C).

Due to the fact that the output voltage 1021 is zero before the transition, the transistor M17 is conducting at the time of the transition. Thus, the sum of the internal resistances of transistors M17 and M16 forms a voltage divider bridge with the internal resistance of transistor M14, to reduce the drop in the first gate voltage 10312 (plateau in FIG. 2D) and reduce the increase in the drain current from the first output transistor 1031. The current in the divider bridge is shown by the drain current 106 from transistor M17 (FIG. 2E).

The result is to limit the slew rate of the output signal 1021.

Figure 2E:
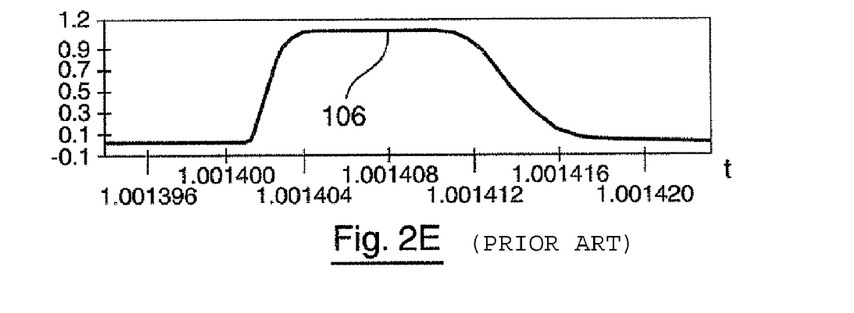

When the output voltage level becomes sufficiently high, the transistor M17 is cut off and the drain current 106 from transistor M17 drops to zero (FIG. 2E). The signal 10311 applied to the gate of the output transistor 1031 changes to zero.

FIGS. 3A to 3E present curves showing the output voltage 1021 (FIG. 3B), the first gate voltage 10312 (FIG. 3D), the second gate voltage 10322 (FIG. 3C) and the drain current (FIG. 3E) from transistor M10 of the output buffer in FIG. 1 in response to an input signal 1011 in the form of a voltage step changing from 5 V (VDC) to 0 V (FIG. 3A), as a function of time t (in milliseconds).

In these curves, the voltage is shown in V and the current 107 is shown in mA. The time step of the curves in FIG. 3A to 3D is the same as for the curve in FIG. 3E.

The voltage step (FIG. 3A) from VDC equal to 0 applied to input 101 corresponds to a transition from a logical 1 to a logical 0.

Figure 3A:
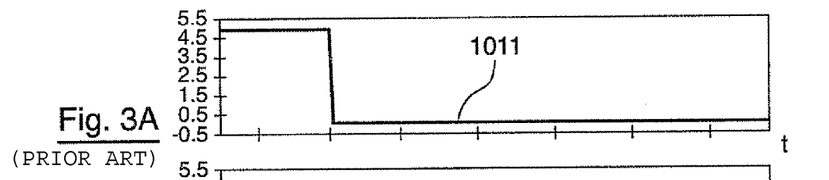
FIGS. 3A to 3E present curves for this conventional output buffer 100 showing the output voltage (FIG. 3B), the first gate voltage (FIG. 3D) and the second gate voltage (FIG. 3C) and the drain current (FIG. 3E) from transistor M10 in the buffer in FIG. 1 in response to a voltage step changing from 5 to 0V (FIG. 3A), as a function of time.
Figures 3B, 3C, 3D, 3E:
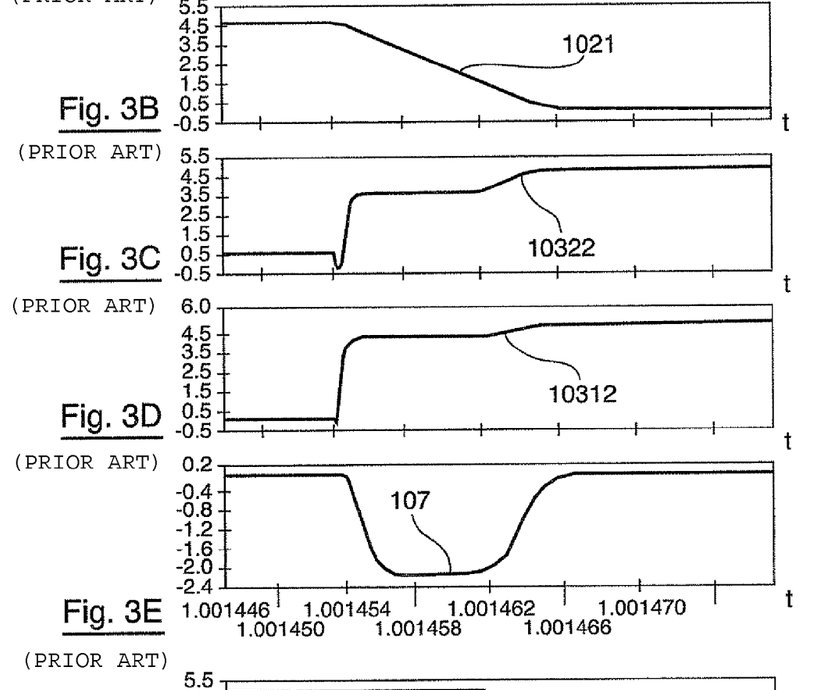

Starting from such a transition from a logical 1 to a logical 0 at the input signal 1011, the transistor M15 becomes conducting and the first gate voltage 10312 rises quickly from 0 to VDC (as shown by FIG. 3D).

Due to the fact that the output voltage 1021 is equal to VDC before the transition, the transistor M10 becomes conducting at the time of the transition. Thus, the sum of the internal resistances of transistors M10 and M12 forms a voltage divider bridge with the internal resistance of transistor M13 that reduces the increase in the second gate voltage 10322 (plateau in FIG. 3C) and reduces the increase in the drain current from the second output transistor 1032. The current in the divider bridge is shown by the drain current 107 from transistor M10 (FIG. 3E).

The consequence is to limit the slew rate of the output signal 1021.

When the output voltage level reaches a sufficient value, the transistor M10 is cut off and the drain current 107 from transistor M10 drops to 0 (FIG. 3E). The signal 10322 applied to the gate of the output transistor 1032 changes to 1.

Figures 4A, 4B:
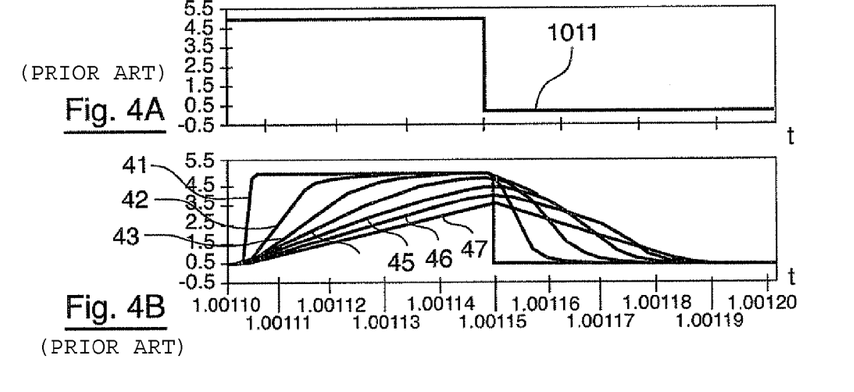
FIGS. 4A and 4B present curves for this conventional output buffer 100 showing the output voltage (FIG. 4B) of the buffer in FIG. 1 in response to a voltage step (FIG. 4A) as a function of time, for different values of the load capacitance.

FIGS. 4A and 4B present curves 41, 42, 43, 44, 45, 46 and 47 showing the output voltage 1021 (FIG. 4B) from the output buffer 100 in response to an input signal 1011 in the form of a voltage step from 0 to VDC (FIG. 4A) for capacitances C1 equal to 0 pF, 50 pF, 100 pF, 150 pF, 200 pF, 250 pF and 300 pF respectively, as a function of time t (in milliseconds).

Voltage curves are shown in V. The time step of the curve in FIG. 3A is the same as the time step of the curve in FIG. 3B.

When the capacitance C1 increases, the divider bridge formed by the sum of the internal resistances of transistors M17 and M16 and by the internal resistance of transistor M14 limits the drop of the first gate voltage 10312 and the increase in the drain current from the first control transistor 1031, regardless of the value of C1.

When the capacitance C1 increases, the divider bridge formed by the sum of internal resistances of transistors M10 and M12 and by the internal resistance of transistor M13 limits the increase in the second gate voltage 10322 and the increase in the drain current from the second control transistor 1032 regardless of the value of C1.

Note that the following expression is true during a transition from 0 to VDC:

$$V_{output} = I_{dp} \cdot t / C_1 \quad (1)$$

where $V_{output}$ is the output voltage 1021, $I_{dp}$ is the drain current from the first control transistor 1031 and t is time.

The voltage $V_{gs}$ applied on the gate of transistor 1031 in the output stage only depends on the divider bridge formed by transistors M16, M17 and M14.

The following expression is true during a transition from VDC to 0 takes place:

$$V_{output} = I_{dn} \cdot t / C_1 \quad (2)$$

where $I_{dn}$ is the drain current from the second control transistor 1032.

The drain current $I_d$ from a transistor is given by the following expression:

$$I_d = K \cdot W/L \cdot (V_{gs} - V_t) \quad (3)$$

where K and $V_t$ are constants that depend on the manufacturing process of the transistor, $V_{gs}$ is the voltage between the gate and the source of the transistor and W and L are the width and length respectively of the transistor channel.

The voltage $V_{gs}$ applied to the gate of transistor 1032 in the output stage depends only on the divider bridge formed by transistors M10, M12 and M13.

Thus, relations (1), (2) and (3) show that the maximum slew rate of the output voltage 1021 depends on the capacitance C1 of the load at the output from the buffer 100 (as shown in FIG. 4B) and also depends on the parameters of the process for manufacturing of the first control transistor 1031 and the second control transistor 1032.

This dependence of the output voltage on the load capacitance C1 is a problem when making an output buffer.

In particular as shown in FIG. 4B, when the value of the load capacitance at the output is low, the maximum slew rate of the output signal is high, which generates a high noise level through the output buffer 100.

This high noise level can disturb operation of other devices around the periphery of the output buffer 100. This is particularly annoying for example for onboard electronics, and is unfavourable for EMC (ElectroMagnetic Compatibility).

SUMMARY

An electronic driver device is provided for an external load, to which an input signal is applied at its input and that produces an output signal to the external load from its output.

According to an embodiment of the disclosure, such a device comprises means of programming and reducing dependence of the slew rate of the output signal on the external load capacitance.

The general principle of an embodiment of the disclosure is based on the use of an external load of an electronic module in an electronic driver device in order to reduce or even eliminate dependence of the maximum slew rate of the output signal from the device on the capacitance of the device load.

Advantageously, the means of reducing dependence of the output signal slew rate on the capacitance of the external load include:
  a programmable ramp generator comprising at least one input to which the input signal is applied, the ramp generator outputting a signal called the signal output by the ramp generator, and
  retroactive means of processing this output signal taking account of the difference between the output signal and the signal output by the ramp generator and also intended to approximately equalize the output signal and said signal output by the ramp generator.

Thus, starting from a programmable ramp generator outputting a pulse signal with determined rise and fall slew rates independent of the capacitance of the external load and the retroactive output signal processing means comparing the output signal with the signal output by the ramp generator, the output signal from the electronic device is made independent of the load capacitance.

Preferably, the retroactive processing means comprise means of amplifying the difference between the output signal and the signal output by the ramp generator.

According to one preferred characteristic of an embodiment of the disclosure, the amplification means include at least one first differential amplifier comprising P type transistors and a second differential amplifier comprising N type transistors.

According to one advantageous aspect of the disclosure, the first and second differential pairs of said first and second amplifiers respectively are connected to:
  first and third static current sources and
  second and fourth current sources controlled by the first and second dynamic signals, and when the difference in amplitude between the output signal and the signal produced by the ramp generator is greater than a first predetermined threshold, the first and second dynamic signals are equal to the first and second values respectively to reduce the response time of the amplification means.

Thus, for example, during output signal transitions that are usually characterized by the fact that the output signal is different in amplitude from the signal produced by the ramp generator due to the fact that the slew rate of the rise and fall signals of the electronic device is limited, the dynamic voltage signals are used to increase the slew rate of rise and fall signals at the output from the device.

Preferably, the processing means also include means of generating first and second dynamic signals starting from the difference between the output signal and the signal produced by the ramp generator.

Advantageously, the first and second dynamic signal generation means comprise means of comparing a first current depending on the difference between the output signal and the signal produced by the ramp generator and a second reference current such that:
  when the difference in amplitude between the first current and the second current is greater than or equal to a second threshold, then the first and second dynamic signals are equal to said first and second values.

Thus, preferably, the dynamic voltage signals change logical level when the output signal becomes more different from the pulse signal, in other words essentially during sudden changes of the input signal (for example during transitions of the output signal from a low level to a high level or vice versa).

For example, the second threshold may be equal to 1 uA.

According to one preferred characteristic of the disclosure, the electronic device comprises first and second output transistors for which the drains are connected to said output, the amplification means comprising first and second switches that:
  connect the input to the gates of the first and second output transistors respectively, when the difference in amplitude between the output signal and the signal output by the ramp generator is less than said first threshold;
  connect the first and second amplified outputs of said first and second amplifiers to the gates of the first and second output transistors respectively, when the amplitude difference between the output signal and the signal output by the ramp generator is greater than or equal to said first threshold.

Thus, connection of the first and second amplified outputs from said first and second amplifiers to the gates of the first and second output transistors respectively, in particular enables the amplification means to slave the output voltage to the signal generated by the ramp generator for high capacitive loads on this output.

Thus, between two transitions of the input signal, the output transistors (forming the output stage) are equivalent to an "inverter" circuit connected to the input signal. This enables the electronic driver device to generate high level and low level outputs close to the power supply rails. Consequently, in particular connecting the input to the gates of the first and second output transistors respectively can reduce static consumption of the output buffer.

Advantageously, when the difference in amplitude between the output signal and the signal output by the ramp generator is greater than or equal to said first threshold, an output buffer including amplification means and said first and second output transistors forms a follower amplifier, the input of which is connected to the signal output by the ramp generator and for which the output coincides with the output from the electronic driver device.

Thus, at the time of a transition of the input signal, the amplification means and the output stage form an output buffer that is equivalent to a "follower amplifier", the input of which is connected to the signal output by the ramp generator, and the output of which coincides with the output from the output buffer. This slaves the rise and fall slew rate of the output to the rise and fall slew rate of the signal output by the ramp generator.

Preferably, the first and second thresholds are such that when the amplitude difference between the output signal and the signal output by the ramp generator is greater than or equal to said first threshold, then the amplitude difference between the first and second currents is greater than the second threshold, and when the amplitude difference between the output signal and the signal output by the ramp generator is less than said first threshold, then the amplitude difference between the first and second currents is less than the second threshold.

Advantageously, the programmable ramp generator comprises a source current.

The disclosure also relates to an integrated component comprising an electronic driver device for an external load like that described above.

BRIEF DESCRIPTION OF THE DRAWINGS

Other characteristics and advantages of the disclosure will become clearer after reading the following description of an embodiment given as a simple and non-limitative example, and the appended drawings among which.

DETAILED DESCRIPTION OF ILLUSTRATIVE EMBODIMENTS

Figure 5:
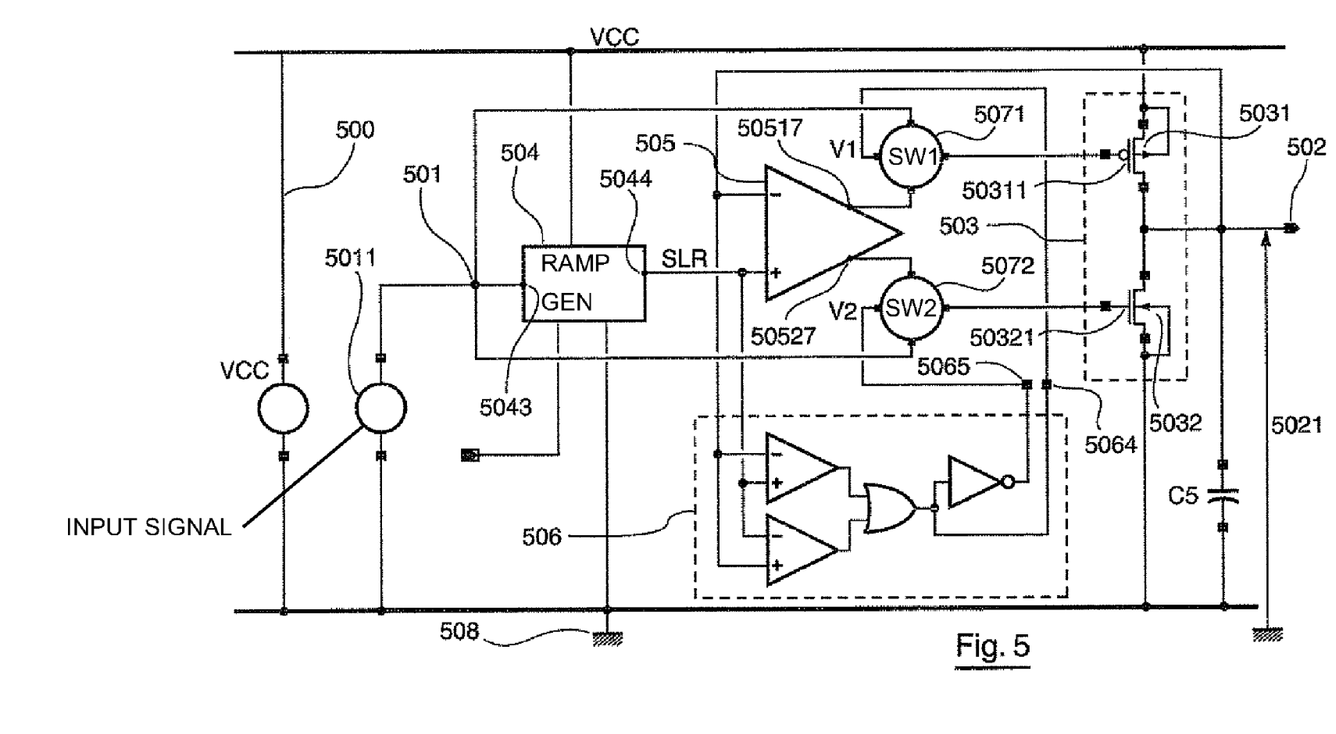
FIG. 5 presents a complete architecture of an output buffer that includes means of reducing dependence of the maximum slew rate of its output signal on the load capacitance in accordance with an embodiment of the disclosure.

An electronic driver device (for example an output buffer) is presented with reference to FIG. 5 for an external load C5 that comprises means of reducing the dependence of the maximum slew rate of its output signal on the load capacitance, in accordance with an embodiment of the disclosure.

This output buffer 500 is powered by a voltage VDC that may be for example equal to 5V. The reference of the potentials of this output buffer 500 is the ground 508.

It comprises an input 501 to which an input signal 5011 is applied, and an output 502 producing an output signal 5021 to the load C5, (that for example is a capacitance of 50 pF).

This output buffer 500 also comprises an output stage 503 comprising a first PMOS type output transistor 5031 and a second NMOS type output transistor 5032 (the output transistors can also be called "output stages"), the drains of which are connected to the output 502. The source of the first output transistor 5031 is connected to the power supply VDC and the source of the second output transistor 5032 is connected to the ground 508.

The means of reducing the dependence of the maximum slew rate of the output signal 5021 on the load capacitance C5 include a ramp generator 504 (described below with reference to FIG. 6) including an input 5043 to which the input signal 5011 is applied and an output 5044 through which it outputs a signal SLR with adjustable rise and fall slew rates;

means of retroactive processing of the output signal 5021 (aimed at approximately equalising the output signal 5021 with the signal SLR themselves comprising:

means 505 (described below with reference to FIG. 7) of amplifying the difference between the output signal 5021 and the pulse signal SLR comprising a first amplifier 50501 based on P type MOS transistors and a second amplifier 5052 based on N type MOS transistors;

means 506 (described below with reference to FIG. 8) of generating first V1 and second V2 dynamic voltage signals starting from the difference between the output signal 5021 and the SLR signal.

The amplification means include the first switch 5071 and the second switch 5072 (operation of which is described below with reference to FIGS. 9A to 9E) controlled by the first and second dynamic voltage signals.

The amplification means 505 have two operating modes. These two operating modes are selected using the first switch 5071 and the second switch 5072, and are:
 a "dynamic mode" during which the first switch 5071 and the second switch 5072 are activated such that the first amplified output 50517 and the second amplified output 50527 are connected to the gates 50311 and 50321 of the first output transistor 5031 and the second output transistor 5032 respectively of the output stage 503. In this case, the amplification means 505 behave globally like an amplifier in follower mode. The positive input of this amplifier is connected to the SLR signal, the negative input is connected to the output 502 of the output buffer;
 a "static mode" during which the first switch 5071 and the second switch 5072 are activated such that the input 501 to the ramp generator 504 is directly connected to the gates 50311 and 50321 of the first output transistor 5031 and second output transistor 5032 of the output stage 503.

As described below with reference to FIGS. 9A to 9E, the first dynamic voltage signal V1 and the second dynamic voltage signal V2 are generated from the difference between the output signal 5021 and the SLR signal. When the difference between the output signal 5021 and the SLR signal becomes greater than a threshold value, the amplifier 505 operates in dynamic mode.

Figure 6:
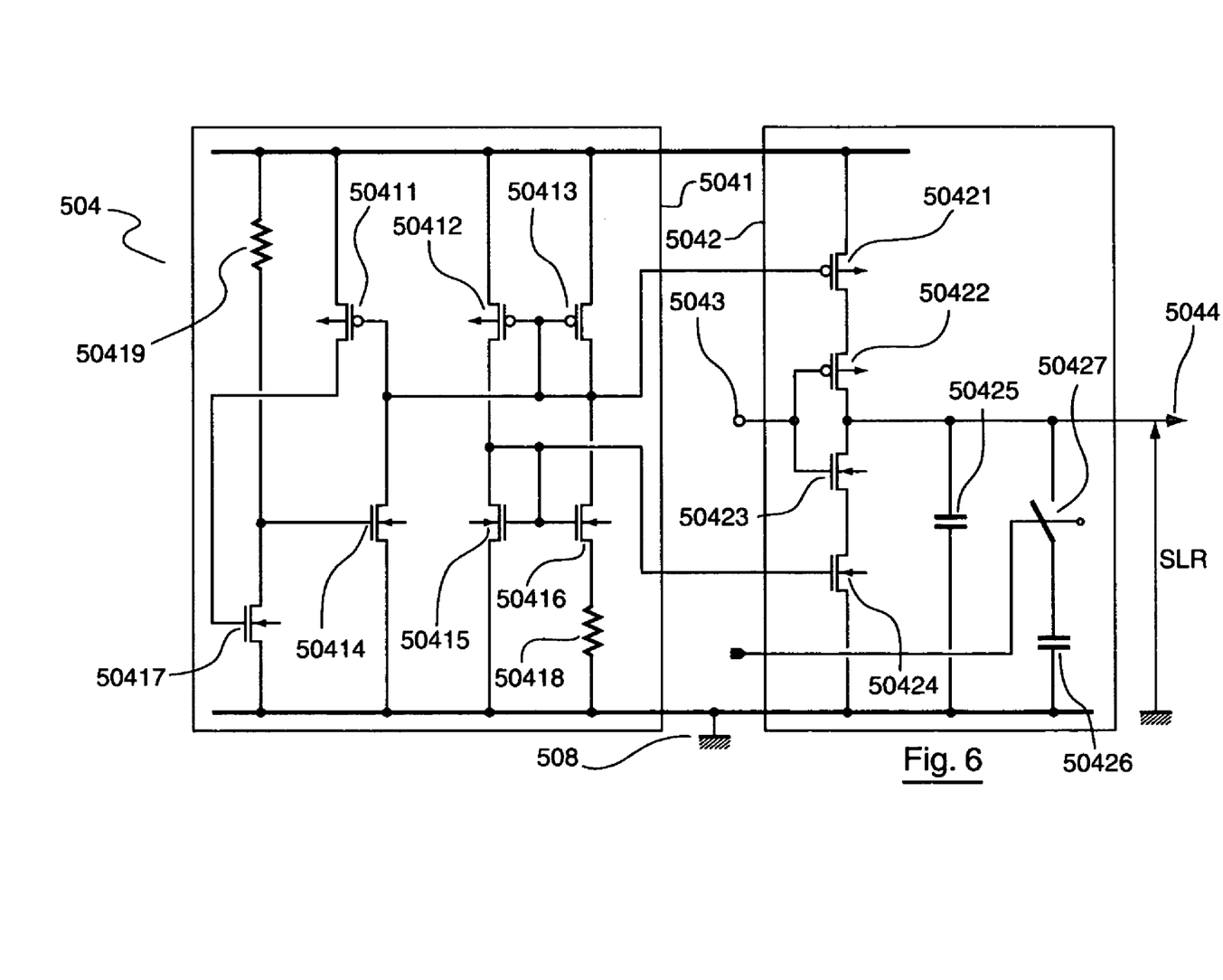
FIG. 6 presents a diagram of an embodiment according to the disclosure showing the programmable ramp generator in the output buffer in FIG. 5.

We will now describe a ramp generator 504 according to the embodiment of the disclosure, with reference to FIG. 6.

The pulse generator 504 includes:
 a conventional programmable ramp generator 5042 that is made for example (as shown in FIG. 6) from transistors 50421 to 50424 installed as a "controlled current inverter", the output of which is connected to a first capacitor 50425. A second capacitor 50426 may be installed in parallel with the capacitor 50425 if the switch 50427 is conducting, so that the global capacitance at the output from the inverter can be varied, and the rise and fall slew rates of the SLR signal can be varied.
 a conventional current source 5041 that may for example be made from transistors 50411 to 50417 and from resistances 50418 and 50419 (that for example are equal to 30 kΩ and 1 MΩ) as shown in FIG. 6.

The potentials of this ramp generator 504 are referenced to the ground 508.

Thus, the ramp generator 504 produces an output 5044 consisting of the SLR signal for which the rise and fall slew rates are adjustable.

Figure 7:
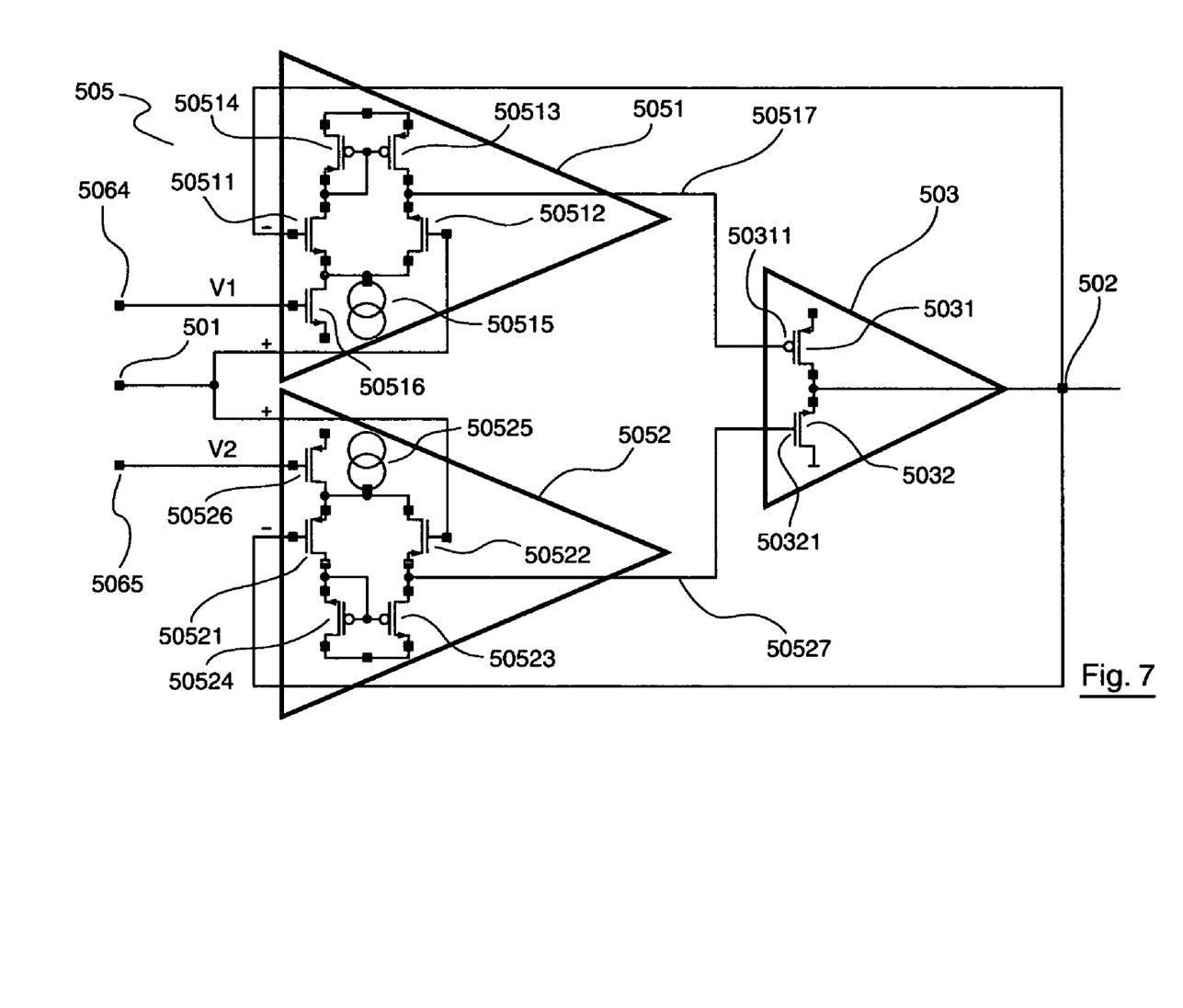
FIG. 7 presents a simplified diagram of an embodiment according to the disclosure showing means of retroactively processing the output signal, comparing the output signal with the signal output by the ramp generator in the output buffer in FIG. 5.

We will present the amplification means 505 and the output stage 503 according to an embodiment of the disclosure, with reference to FIG. 7.

The diagram shown in FIG. 7 is simpler than that shown in FIG. 5, but it does not include the first switch 5071 and the second switch 5072. This diagram is an equivalent diagram of the stage 505 in FIG. 5 during dynamic mode.

The amplification means 505 include the first and second amplifiers 5051 and 5052 mentioned above.

The first amplifier 5051 is a conventional differential amplifier comprising a first differential pair of transistors 50511, 50512 of the N type, and two other P type transistors 50513, 50514. The gate of the transistor 50511 in the first differential pair is connected to the output 502 from the output buffer and the gate of transistor 50512 in the first differential pair is connected to the input 501 to the amplification means 505.

The first differential pair 50511, 50512 of the first amplifier 5051 is connected to:
 a first current source 50515 outputting a static current (for example outputting a current of 1 µA);
 a second current source made by means of an N type transistor 50516. This transistor 50516 is controlled by the first dynamic signal V1. The second current source is only activated when the amplification means 505 are in "dynamic mode", in order to limit the current through the first differential pair 50511, 50512 when the amplification means 505 are in "static mode".

The second amplifier 5052 is a conventional differential amplifier comprising a second differential pair of P type transistors 50521, 50522 and two other N type transistors 50523, 50524. The gate of transistor 50521 in the second differential pair is connected to the output 502 from the output buffer and the gate of transistor 50522 in the second differential pair is connected to the input 501 of the amplification means 505.

The second amplifier 5052 is powered by:
 a third current source 50525 outputting a static current (for example outputting a current of 1 µA);
 a fourth current source made by means of a P type transistor 50526. This transistor 50526 is controlled by the second dynamic signal V2. The fourth current source is only activated when the amplification means 505 are in "dynamic mode" in order to limit the current through the second differential pair 50521, 50522 when the amplification means 505 are in "static mode".

The first amplified output 50517 and the second amplified output 50527 (connected to the sources of transistors 50513 and 50523 respectively) of the first amplifier 5051 and the second amplifier 5052 are connected to gates 50311, 50321 of the first and second output amplifiers 5031 and 5032 respectively, of the output stage 503.

With this arrangement of the amplification means 505, an output buffer 500 is obtained for which the amplitude of the output signal can cover the entire voltage range varying from 0 V to VDC (rail-to-rail circuit) for which the rise and fall slew rate of the output signal 502 is the same as the rise and fall slew rate of the programmable SLR signal.

Figure 8:
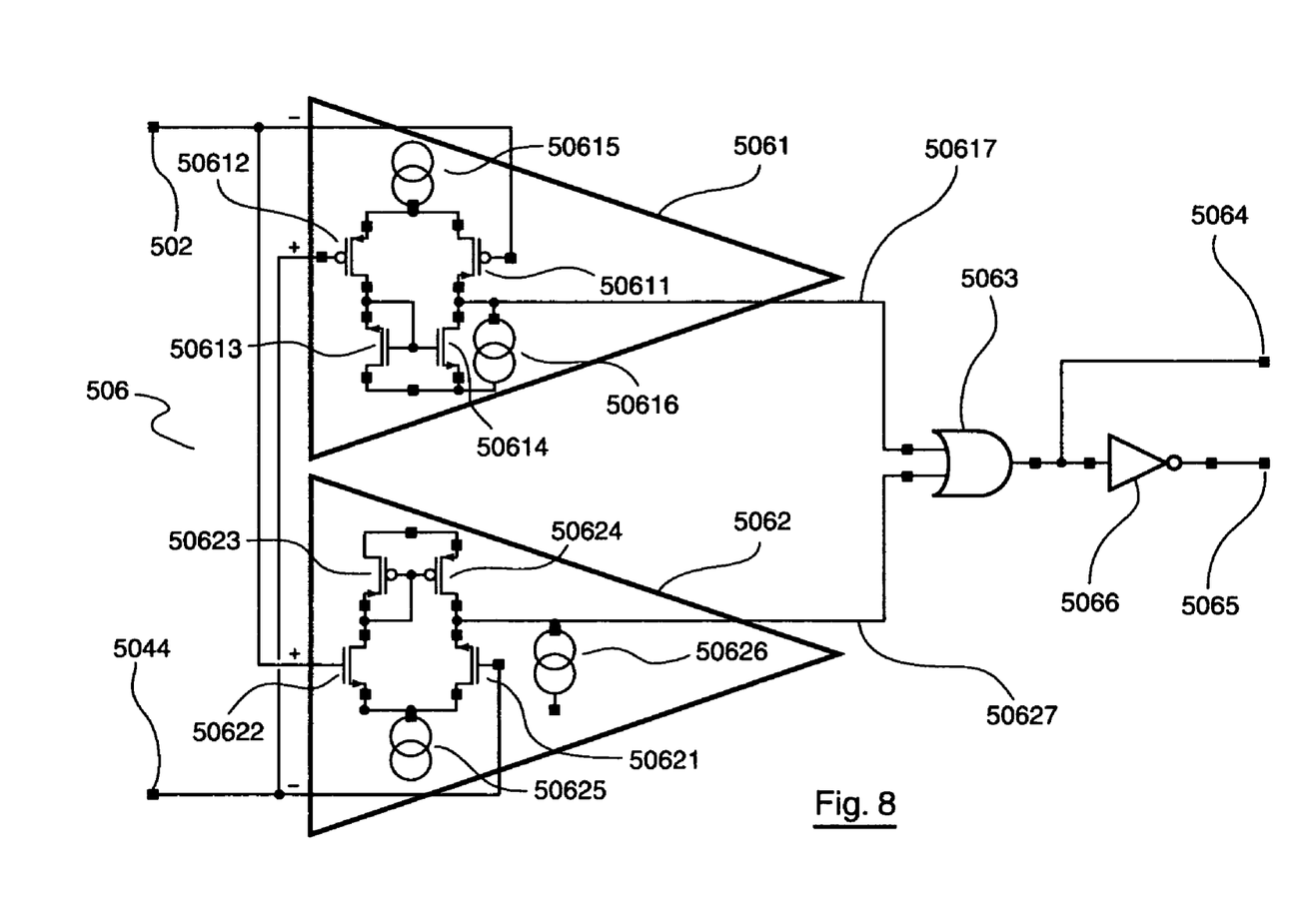
FIG. 8 presents a diagram showing an embodiment of the means of generating first and second dynamic signals starting from the difference between the output signal and the signal output by the ramp generator in the output buffer in FIG. 5.

We will now describe the means 506 of generating first and second dynamic signals V1 and V2 starting from the difference between the output signal 5021 and the SLR signal according to an embodiment of the disclosure, with reference to FIG. 8.

The generation means 506 include means of comparing a current dependent on the difference between the output signal 5021 and the SLR signal, and a reference current Iref.

The comparison means include third and fourth differential amplifiers 5061 and 5062.

The third differential amplifier 5061 is a conventional differential amplifier comprising a third differential pair of P type transistors 50611, 50612 and two other N type transistors 50613, 50614. The gate of the transistor 50611 in the third differential pair is connected to the output 502 from the output buffer 500 and the gate of transistor 50612 in the third differential pair is connected to the output 5044 from the ramp generator outputting the SLR signal.

The third differential pair 50611, 50612 of the third differential amplifier 5061 is connected to a fifth current source 50615 outputting a static current. The third differential amplifier 5061 also includes a sixth current source 50616 outputting a reference current.

The fourth differential amplifier 5062 is a conventional differential amplifier comprising a fourth differential pair of N type transistors 50621, 50622 and two other P type transistors 50623, 50624. The gate of transistor 50622 in the fourth differential pair is connected to the output 502 of the output buffer 500 and the gate of transistor 50621 in the fourth differential pair is connected to the output 5044 of the ramp generator outputting the SLR signal.

The fourth differential pair 50621, 50622 of the fourth differential amplifier 5062 is connected to a seventh current source 50625 outputting a static current. The fourth differential amplifier 5062 also includes an eighth current source 50626 outputting the reference current.

For example, the fifth 50615, sixth 50616, seventh 50625 and eighth 50626 current sources output 5 uA, 1 uA, 5 uA and 1 uA respectively.

The first and second outputs 50617 and 50627 (connected to the drains of transistors 50614 and 50624 respectively) of the third and fourth differential amplifiers 5061 and 5062 are connected to two inputs of a logical OR gate 5063. The output from the OR gate 5063 is connected to a first output 5064 outputting the first dynamic signal V1 and to a second output 5065 outputting the second dynamic signal V2 through an inverter 5066.

We will now describe operation of the output buffer 500. We will present curves showing the SLR signal (FIG. 9B), the first dynamic signal V1 (FIG. 9C), the output signal 5021 (FIG. 9D) and the current IC5 in the load C5 on the output buffer 500 in response to an input signal 5011 (FIG. 9A), as a function of time t (in microseconds), with reference to FIGS. 9A to 9E.

The curves show voltages in V and current IC5 in mA. The time scale of the curves in FIGS. 9A to 9D are the same as the time scales of the curve in FIG. 9E.

Figure 9A:
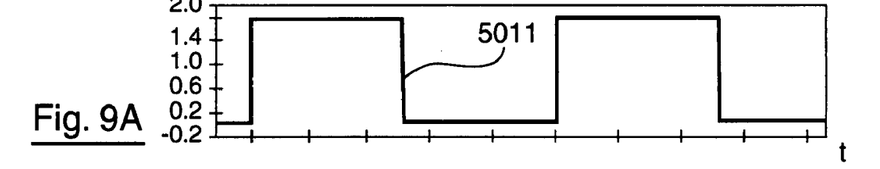
FIGS. 9A to 9E present curves showing the signal output by the ramp generator (FIG. 9B), the first dynamic signal (FIG. 9C), the output signal 5021 (FIG. 9D) and the load current in the output buffer in FIG. 5 as a function of time t (in microseconds), in response to an input signal (FIG. 9A)
Figure 9B:
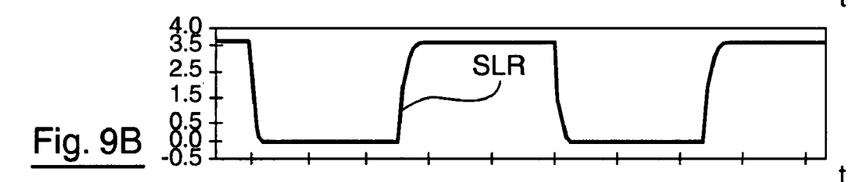
Figure 9C:
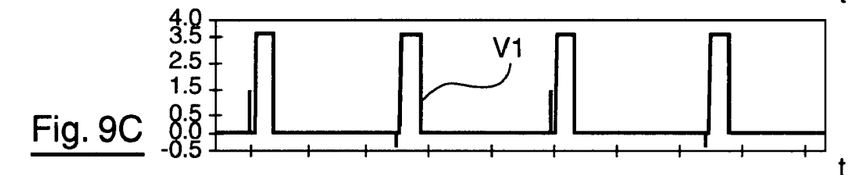
Figure 9D:
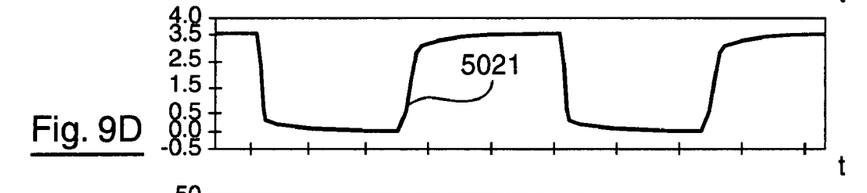
Figure 9E:
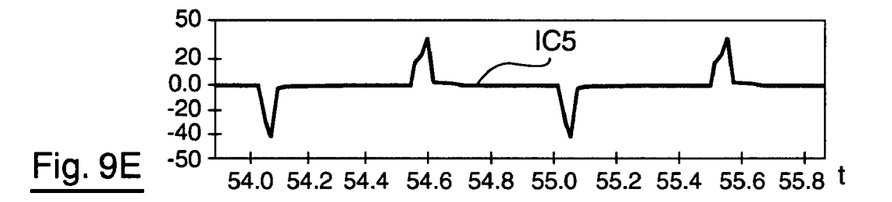

The input signal 5011 is a logical signal for which the low level is equal to 0 and the high level is equal to VDC_logical (namely about 1.8 V).

The voltage difference between the output signal 5021 and the SLR signal is converted into a current, hereinafter denoted the "differential current" by the third and fourth amplifiers 5061 and 5062 of the generation means 506.

The generation means 506 compare the differential current (dependent on the difference between the output signal 5021 and the SLR signal) and the reference current.

During a transition of the input signal 5011 (from the low level to the high level or vice versa), the difference between the output signal 5021 and the SLR signal becomes greater than a threshold value (for example 0.5V), then the differential current in one of the third 50611, 50612 or fourth 50621, 50622 differential pairs becomes greater than the reference current. Consequently, the generation means 506 assign the logical value 1 to the first dynamic signal V1 and the logical value 0 to the second dynamic signal V1, which causes:

activation of the second 50516 and the fourth 50526 current sources in the first and second amplifiers 5051 and 5052 (the first and second dynamic signals V1 and V2 respectively), and the fact that the first and second switches connect the first and second amplified outputs 50517 and 50527 to the gates 50311, 50321 respectively of the first and second output transistors.

Thus, during a transition of the input signal 5011, the amplification means 505 (that operate in dynamic mode) and the output stage 503 form an output buffer that is equivalent to a "follower amplifier", the input of which is connected to the signal output by the ramp generator 504, and the output of which coincides with the output 502 from the output buffer 500. This slaves the rise and fall slew rate of the output 502 to the rise and fall slew rate of the SLR signal. Activation of the second and fourth current sources 50516 and 50526 enables the amplification means 505 to slave the output voltage 5021 to the SLR signal for high capacitive loads on this output.

Between two transitions of the input signal 5011, the difference between the output signal 5021 and the SLR signal is less than the threshold mentioned above. In this case, the differential current is less than the reference current. Consequently, the generation means 506 give the logical value 0 to the first dynamic signal V1 and the value 0 to the second dynamic signal V2, which causes:

deactivation of the second and fourth current sources 50516 and 50526 in the first and second amplifiers 5051 and 5052 respectively (through the first and second dynamic signals V1 and V2 respectively), and the fact that the first and second switches connect the input 501 to the gates 50311, 50321 of the first and second output transistors 5031 and 5032 respectively.

Thus, between two transitions of the input signal 5011, the amplification means 505 operate in static mode, the output stage 503 is equivalent to an "inverter" connected to the input signal 5011. This enables the output buffer 500 to generate high levels and low levels close to the power supply rails at the output. This also makes it possible to output high static currents due to a high voltage $V_{GS}-V_T$ for the output stage transistors 5031 and 5032. Deactivation of the second and fourth current sources 50516 and 50526 respectively during this phase can reduce the static consumption of the output buffer.

Figure 10:
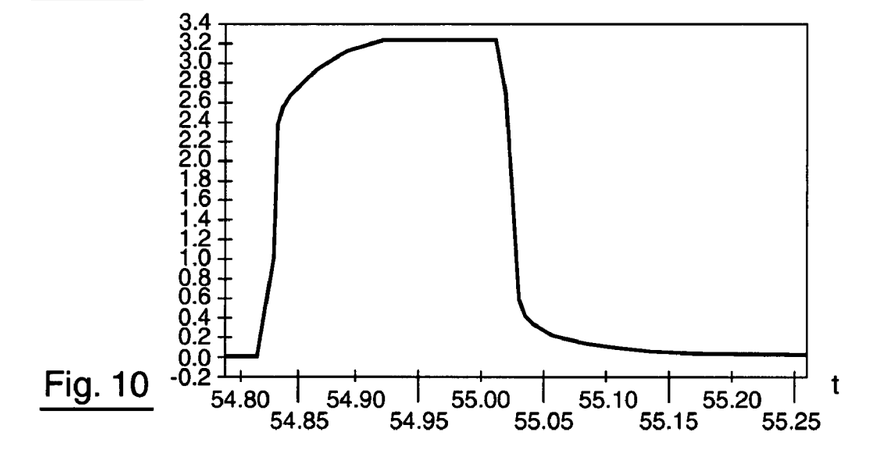
FIG. 10 presents curves showing the output voltage from the output buffer in FIG. 5 in response to a voltage step for loads for which the capacitance is equal to 0 pF, 50 pF, 100 pF, 150 pF, 200 pF, 250 pF and 300 pF, as a function of time t.

We will now present several curves with reference to FIG. 10 showing the output voltage 5021 from the output buffer 500 in response to an input signal 5011 in the form of a voltage step for which the low level is equal to 0 and the high level is logical_VDC applied to input 501 of the output buffer 500 respectively, for loads C5 for which the capacitance is equal 0 pF, 50 pF, 100 pF, 150 pF, 200 pF, 250 pF and 300 pF, as a function of time t (in microseconds).

It can be seen that these curves are practically coincident, which shows that the maximum slew rate of the output signal 5021 from the output buffer 500 according to the disclosure is practically independent of the load capacitance C5.

One or more embodiments of the disclosure thus overcome disadvantages according to prior art.

At least one embodiment provides a technique for reducing the dependence of the maximum slew rate of the output signal from an output buffer on the load capacitance placed at the output from the buffer.

Note that formulation of this purpose is itself new and inventive since a person skilled in the art of output buffers would never have envisaged the use of such an architecture to reduce problems related to dependence on the load capacitance.

An embodiment also implements such an output buffer to output a high static current to the load.

An embodiment further provides such an output buffer that generates low noise compared with conventional output buffers.

An embodiment further provides such a buffer that is easy to make at low cost.

Although the present disclosure has been described with reference to one or more embodiments, workers skilled in the art will recognize that changes may be made in form and detail without departing from the spirit and scope of the disclosure or the appended claims.

What is claimed is:

1. Electronic driver device for an external load comprising an input to which an input signal is applied and an output that produces an output signal to the external load, wherein the electronic driver device comprises means of reducing dependence of the slew rate of the output signal on the external load capacitance, said means of reducing dependence of the output signal slew rate on the capacitance of the external load include:
   a programmable ramp generator comprising at least one input to which said input signal is applied, said ramp generator outputting a signal output by the ramp generator, and
   retroactive means of processing the output signal comprising means of amplifying a value corresponding to a difference in amplitude between the output signal and said signal output by the ramp generator, said retroactive means approximately equalizing the output signal and said signal output by the ramp generator,
said amplification means including at least one first differential amplifier comprising P type transistors and a second differential amplifier comprising N type transistors,
and wherein first and second differential pairs of said first and second amplifiers respectively are connected to:
   first and third static current sources and
   second and fourth current sources controlled by first and second dynamic signals, respectively, generated by means of generating dynamic signals,
and wherein, when the difference in amplitude between the output signal and the signal output by the ramp generator is greater than a first predetermined threshold, the first and second dynamic signals are equal to first and second values respectively to reduce the response time of the amplification means.

2. Electronic driver device set forth in claim 1, wherein retroactive means of processing the output signal also include means of generating first and second dynamic signals starting from the difference in amplitude between the output signal and said signal output by the ramp generator.

3. Electronic driver device set forth in claim 2, wherein means of generating dynamic signals comprise means of comparing a first current depending on the difference in amplitude between the output signal and said signal output by the ramp generator and a second reference current such that:
   when the difference in amplitude between the first current and the second current is greater than or equal to a second threshold, then the first and second dynamic signals are equal to said first and second values.

4. Electronic driver device set forth in claim 1, said electronic driver device comprising first and second output transistors for which the drains are connected to said output, wherein said amplification means comprise first and second switches controlled by said first and second dynamic signals that:
   connect said input to the gates of the first and second output transistors respectively, when the difference in amplitude between the output signal and said signal output by the ramp generator is less than said first threshold;
   connect the first and second amplified outputs of said first and second amplifiers to the gates of the first and second output transistors, respectively, when the difference in amplitude between the output signal and the signal output by the ramp generator is greater than or equal to said first threshold.

5. Electronic driver device set forth in claim 4, wherein when the difference in amplitude between the output signal and said signal output by the ramp generator is greater than or equal to said first threshold, an output buffer including amplification means and said first and second output transistors forms a follower amplifier, the input of which is connected to said signal output by the ramp generator and for which the output coincides with the output from the electronic driver device.

6. Electronic driver device set forth in claim 3, wherein the first and second thresholds are such that when the difference in amplitude between the output signal and said signal output by the ramp generator is greater than or equal to said first threshold, then the difference in amplitude between the first and second currents is greater than the second threshold, and when the difference amplitude between the output signal and said signal output by the ramp generator is less than said first threshold, then the difference in amplitude between the first and second currents is less than the second threshold.

7. Electronic driver device set forth in claim 1 wherein the programmable ramp generator comprises a source current.

8. An integrated component comprising the electronic driver device for an external load according to claim 1.

9. Electronic driver device for an external load, wherein the electronic device comprises:
   an input to which an input signal is applied;
   an output that produces an output signal to the external load;
   a programmable ramp generator comprising at least one input to which said input signal is applied, said ramp generator outputting a signal output by the ramp generator; and
   a retroactive processor, which processes the output signal and includes an amplifier, which amplifies a difference in amplitude between the output signal and said signal output by the ramp generator, said amplifier approximately equalizing the output signal and said signal output by the ramp generator, said amplifier including at least one first differential amplifier comprising P type transistors and a second differential amplifier comprising N type transistors, and wherein first and second differential pairs of said first and second amplifiers respectively are connected to:
   first and third static current sources; and
   second and fourth current sources controlled by first and second dynamic signals, respectively, generated by a generator,
   and wherein, when the difference in amplitude between the output signal and said signal output by the ramp generator is greater than a first predetermined threshold, the first and second dynamic signals are equal to first and second values respectively to reduce a response time of the amplifier.

10. Electronic driver device set forth in claim 9, wherein said retroactive processor which processes the output signal also includes a generator, which generates first and second dynamic signals starting from the difference in amplitude between the output signal and said signal output by the ramp generator.

11. Electronic driver device set forth in claim 10, wherein said generator of the first and second dynamic signals comprises a comparator, which compares a first current depending on the difference between the output signal and signal output by the ramp generator and a second reference current such that:

when the difference in amplitude between the first current and the second current is greater than or equal to a second threshold, then the first and second dynamic signals are equal to said first and second values.

12. Electronic driver device set forth in claim 9, said electronic driver device comprising first and second output transistors for which the drains are connected to said output, wherein said amplifier comprises first and second switches that:

connect said input to the gates of the first and second output transistors respectively, when the difference in amplitude between the output signal and said signal output by the ramp generator is less than said first threshold;

connect the first and second amplified outputs of said first and second amplifiers to the gates of the first and second output transistors, respectively, when the amplitude difference between the output signal and the signal output by the ramp generator is greater than or equal to said first threshold.

13. Electronic driver device set forth in claim 12, wherein when the difference in amplitude between the output signal and said signal output by the ramp generator is greater than or equal to said first threshold, an output buffer including the amplifier and said first and second output transistors forms a follower amplifier, the input of which is connected to said signal output by the ramp generator and for which the output coincides with the output from the electronic driver device.

14. Electronic driver device set forth in claim 11, wherein the first and second thresholds are such that when the difference in amplitude between the output signal and signal output by the ramp generator is greater than or equal to said first threshold, then the difference in amplitude between the first and second currents is greater than the second threshold, and when the difference in amplitude between the output signal and said signal output by the ramp generator is less than said first threshold, then the difference in amplitude between the first and second currents is less than the second threshold.

15. Electronic driver device set forth in claim 9 wherein the programmable ramp generator comprises a source current.

* * * * *

UNITED STATES PATENT AND TRADEMARK OFFICE
CERTIFICATE OF CORRECTION

PATENT NO. : 7,511,541 B2  
APPLICATION NO. : 11/712225  
DATED : March 31, 2009  
INVENTOR(S) : Joel Chatal et al.

Page 1 of 1

It is certified that error appears in the above-identified patent and that said Letters Patent is hereby corrected as shown below:

Title Page

Item [75] delete "Benraoui" and insert --Bendraoui--

Signed and Sealed this

Fifteenth Day of September, 2009

David J. Kappos  
*Director of the United States Patent and Trademark Office*